United States Patent
Smith et al.

(10) Patent No.: US 9,303,205 B2
(45) Date of Patent: Apr. 5, 2016

(54) LATTICE-MISMATCHED CORE-SHELL QUANTUM DOTS

(75) Inventors: Andrew M. Smith, Atlanta, GA (US); Shuming Nie, Atlanta, GA (US)

(73) Assignee: Emory University, Atlanta, GA (US)

( * ) Notice: Subject to any disclaimer, the term of this patent is extended or adjusted under 35 U.S.C. 154(b) by 0 days.

(21) Appl. No.: 13/509,730

(22) PCT Filed: Nov. 15, 2010

(86) PCT No.: PCT/US2010/056694
§ 371 (c)(1),
(2), (4) Date: Jul. 9, 2012

(87) PCT Pub. No.: WO2011/060353
PCT Pub. Date: May 19, 2011

(65) Prior Publication Data
US 2012/0270231 A1  Oct. 25, 2012

Related U.S. Application Data

(60) Provisional application No. 61/261,495, filed on Nov. 16, 2009, provisional application No. 61/261,900, filed on Nov. 17, 2009.

(51) Int. Cl.
| | |
|---|---|
| C09K 11/54 | (2006.01) |
| C09K 11/88 | (2006.01) |
| C09K 11/58 | (2006.01) |
| C09K 11/02 | (2006.01) |
| H01L 33/50 | (2010.01) |

(52) U.S. Cl.
CPC ............... *C09K 11/584* (2013.01); *C09K 11/02* (2013.01); *C09K 11/883* (2013.01); *H01L 33/50* (2013.01)

(58) Field of Classification Search
CPC .......... B82Y 20/00; B82Y 5/00; B82Y 10/00; C09K 11/584; C09K 11/883; C09K 11/565; C09K 11/02; H01L 33/502
See application file for complete search history.

(56) References Cited

U.S. PATENT DOCUMENTS

| | | | |
|---|---|---|---|
| 6,501,091 B1 * | 12/2002 | Bawendi | B82Y 10/00 257/100 |
| 6,607,829 B1 * | 8/2003 | Bawendi | B82Y 30/00 257/E33.004 |
| 6,861,674 B2 | 3/2005 | Perlo | |

(Continued)

FOREIGN PATENT DOCUMENTS

| | | |
|---|---|---|
| EP | EESR10830851.1 | 1/2014 |
| JP | 2005-514744 A | 5/2005 |

(Continued)

OTHER PUBLICATIONS

Smith et al. Tuning the optical and electronic properties of colloidal nanocrystals by lattice strain. Nature Nanotechnology 2008, col. 4, pp. 56-63.*

(Continued)

*Primary Examiner* — Shafiqul Haq
(74) *Attorney, Agent, or Firm* — Emory Patent Group

(57) ABSTRACT

The disclosure relates to lattice-mismatched core-shell quantum dots (QDs). In certain embodiments, the lattice-mismatched core-shell QDs are used in methods for photovoltaic or photoconduction applications. They are also useful for multicolor molecular, cellular, and in vivo imaging.

7 Claims, 5 Drawing Sheets

(56) References Cited

U.S. PATENT DOCUMENTS

| | | |
|---|---|---|
| 7,390,568 B2 | 6/2008 | Kim |
| 2003/0017264 A1 | 1/2003 | Treadway |
| 2006/0227837 A1 | 10/2006 | Lee |
| 2008/0230750 A1 | 9/2008 | Gillies |
| 2009/0242871 A1 | 10/2009 | Kobayashi |

FOREIGN PATENT DOCUMENTS

| | | |
|---|---|---|
| JP | 2006-004658 A | 1/2006 |
| JP | 2006004658 | 5/2006 |
| KR | 10-0668328 B1 | 1/2007 |
| KR | 10-2009-0020676 A | 2/2009 |
| WO | 2004054923 | 6/2004 |
| WO | 2005031802 | 1/2005 |
| WO | 2006054952 | 5/2006 |

OTHER PUBLICATIONS

Cao et al. Growth and properties of semiconductor core/shell nanocrystals with InAs cores. J. Am. Chem. Soc. 2002, vol. 122, pp. 9692-9702.*

Tinjod et al. Key parameters for the formation of II-VI self-assembled quantum dots. Journal of Alloys and Compounds 2004, vol. 371, pp. 63-66.*

He et al. Microwave synthesis of water-dispersed CdTe/CdS/ZnS core-shell-shell quantum dots with excellent photostability and biocompatibility. Adv. Mater. 2008, vol. 20, pp. 3416-3421.*

Duan et al. Solutions of inhomogeneity problems with graded shells and application to core-shell nanoparticles and composites. J. Mech. Phys. Solids 2006, vol. 54, pp. 1401-1425.*

Zhao et al. Synthesis and characterizaiton of high-quality water-soluble near-infrared-emitting CdTe/CdS quantum dots capped by N-acetyl-cysteine via hydrothermal method. J. Phys. Chem. 2009, vol. 113, pp. 1293-1300.*

Hybrid approach to the synthesis of highly luminescent CdTe/ZnS and CdHgTe/ZnS nanocrystals. J. Am. Chem. Soc. 2004, vol. 126, pp. 1926-1927.*

International Preliminary Report on Patentability dated May 31, 2012.

International Search Report dated Jul. 28, 2011.

Smith et al., Nanocrystal synthesis in an amphibious bath: spontaneous generation of hydrophilic and hydrophobic surface coatings. Angewandte Chemie International Edition, 47: 9916-9921 (2008).

Smith et al., Tuning the optical and electronic properties of colloidal nanocrystals by lattice strain. Nature Nanotechnology, 4: 56-63 (2009).

Smith et al., Semiconductor nanocrystals: structure, properties, and bandgap engineering. Accounts of Chemical Research, 43: 190-200 (2010).

Smith et al., Compact quantum dots for single-molecule imaging. Journal of Visualized Experiments, 68: e4236 (2012).

Smith et al., Bioconjugated quantum dots for in vivo molecular and cellular imaging, Advanced Drug Delivery Reviews 60 (2008) 1226-1240.

Kim, et al., (2003), "Type-II Quantum Dots: CdTe/CdSe(Core/Shell) and CdSe/ZnTe(Core/Shell) Heterostructures.", Journal on the American Chemical Society, 125(38): 11466-11467.

Chen et al., Coherency Strain Effects on the Optical Response of Core/Shell Heteronanostructures, Nano Lett. 3, 799-803 (2003).

Kim, et al., (2008), "Contact Printing of Quantum Dot Light-Emitting Devices.", Nano Letters, 8(12): 4513-4517.

Tessler, et al.,(2002), "Efficient Near-Infrared Polymer Nanocrystal Light-Emitting Diodes.", Science, 295(5559):1506-1508.

Coe, et al., (2002), "Electroluminescence from Single Monolayers of Nanocrystals in Molecular Organic Devices.", Letters to Nature, 420(6917): 800-803.

Bruchez Jr., et al., (1998), "Semiconductor Nanocrystals as Fluorescent Biological Labels.", Science, 281(5385): 2013-2016.

Chan, et al., (1998), "Quantum Dot Bioconjugates for Ultrasensitive Nonisotopic Detection.", Science, 281(5385): 2016-2018.

Mattoussi, et al., (2000), "Self-Assembly of CdSe—ZnS Quantum Dot Bioconjugates Using an Engineered Recombinant Protein.", Journal of the American Chemical Society, 122(49):12142-12150.

Smith, et al., (2006), "A systematic Examination of Surface Coatings on the Optical and Chemical Properties of Semiconductor Quantum Dots.", Physical Chemistry Chemical Physics, 8(33):3895-3903.

Pellegrino, et al., (2004), "Hydrophobic Nanocrystals Coated with an Amphiphilic Polymer Shell: A General Route to Water Soluble Nanocrystals.", Nano Letters, 4(4): 703-707.

So, et al., (2006), "Self-Illuminating Quantum Dot Conjugates for in Vivo Imaging.", Nature Biotechnology, 24(3): 339-343.

Lidke, et al., (2004), "Quantum Dot Ligands Provide New Insights into erbB/HER Receptor-Mediated Signal Transduction.", Nature Biotechnology, 22(2): 198-203.

Zhang, et al., (2005), "Single-Quantum-Dot-Based DNA Nanosensor.", Nature materials, 4(11): 826-831.

Al-Douri, et al., (2002), "Calculation of Bulk Moduli of Semiconductor Compounds.", Physica B: Condensed Matter, 322(1):179-182.

Bawendi, et al., (1989), "X-ray Structural Characterization of Larger CdSe Semiconductor Clusters.", The Journal of Chemical Physics, 91(11):7282-7290.

Iyer, et al., (2006), "Peptide Coated Quantum Dots for Biological Applications.", IEEE Transactions on NanoBioscience, 5(4): 231-238.

Hikmet, et al., (2003), "Study of Conduction Mechanism and Electroluminescence in CdSeÖZnS Quantum Dot Composites.", Journal of Applied Physics, 93(6): 3509-3514.

Huynh, et al., (2002), "Hybrid Nanorod-Polymer Solar Cells.", Science, 295(5564): 2425-2427.

Kniprath, et al., (2009), "Hybrid photovoltaic cells with II-VI quantum dot sensitizers fabricated by layer-by-layer deposition of water-soluble components.", Thin Solid Films, 518(1): 295-298.

Colvin et al.,Light-emitting diodes made from cadmium selenide nanocrystals and a semiconducting polymer Nature, 1994, 370(4):354.

Bao et al., Enhancement Effect of Illumination on the Photoluminescence of Water-Soluble CdTe Nanocrystals: Toward Highly Fluorescent CdTe/CdS Core-Shell Structure, Chem. Mater. 2004, 16, 3853-3859.

Tian et al., Coupled Composite CdS—CdSe and Core-Shell Types of (CdS)CdSe and (CdSe)CdS Nanoparticles, J. Phys. Chem. 1996, 100, 8927-8939.

Zhang et al. The Influence of Carboxyl Groups on the Photoluminescence of Mercaptocarboxylic Acid-Stabilized CdTe Nanoparticles, J. Phys. Chem. B 2003, 107, 8-13.

Peng et al., Epitaxial Growth of Highly Luminescent CdSe/CdS Core/Shell Nanocrystals with Photostability and Electronic Accessibility, J. Am. Chem. Soc. 1997, 119, 7019-7029.

Pons et al., Hydrodynamic Dimensions, Electrophoretic Mobility, and Stability of Hydrophilic Quantum Dots, J. Phys. Chem. B 2006, 110, 20308-20316.

Cao et al. Growth and Properties of Semiconductor Core/Shell Nanocrystals with InAs Cores , J Am. Chem. Soc. 2000, 122, 9692-9702.

Tinjod et al. Key parameters for the formation of II-VI self-assembled quantum dots, Journal of Alloys and Compounds 371(2004) 63-66.

Sharma et al., Advances in Colloid and Interface Science 123-126 (2006) 471-485.

Dabbousi, B. O. et al. (CdSe)ZnS core-shell quantum dots: Synthesis and characterization of a size series of highly luminescent nanocrystallites, J. Phys. Chem. B 101, 9463-9475, (1997).

Xie et al. Synthesis and characterization of highly luminescent CdSe-Core CdS/Zn0.5Cd0.5S/ZnS multishell nanocrystals. J. Am. Chem. Soc. 127, 7480-7488, (2005).

Wang et al. Preparation of Highly Luminescent CdTe/CdS Core/Shell Quantum Dots. ChemPhysChem 10, 680-685, (2009).

* cited by examiner

LATTICE-MISMATCHED CORE-SHELL QUANTUM DOTS

CROSS REFERENCE TO RELATED APPLICATION

This application claims priority to the PCT application entitled "Lattice-Mismatched Core-Shell Quantum Dots," having Ser. No. PCT/US2010/056694, filed on Nov. 15, 2010. This application also claims priority to and benefit of U.S. Provisional Patent Application no. 61/261,495, filed on Nov. 16, 2009, and U.S. Provisional Patent Application no. 61/261,900, filed on Nov. 17, 2009, both of which are incorporated by reference in their entireties.

STATEMENT REGARDING FEDERAL SPONSORED RESEARCH OR DEVELOPMENT

This invention was made with government support under Grants RO1 CA108468 and U54 CA119338 awarded by the National Institutes of Health. The government has certain rights in the invention.

FIELD

The disclosure relates to lattice-mismatched core-shell quantum dots (QDs). In certain embodiments, the lattice-mismatched core-shell QDs are used in methods for photovoltaic or photoconduction applications. They are also useful for multicolor molecular, cellular, and in vivo imaging.

BACKGROUND

Nanometer scale particles made up of metals typically found in semiconductor materials are generally referred to as quantum dots (QDs). Quantum dots of the same material, but of different sizes, can emit light of different colors. Surface modification of QDs with organic polymers allows one to tailor their properties and incorporate the particles into larger materials. QDs are currently used in numerous electronic and biological applications.

Quantum dots that display properties of Type-II band semiconductor materials are described in Kim et al., J. Am. Chem. Soc 125, 11466-11467 (2003). See also U.S. Pat. No. 7,390,568. Type-II QDs are expected to have useful properties because of the spatial separations of electron charge carriers. Type-II structures can allow access to wavelengths that would otherwise not be available with a single material. In addition, the separation of charges in the lowest excited states of type-II nanocrystals makes these materials more suitable in photovoltaic or photoconduction applications. Thus, there is a need to identify improved Type-II QDs.

SUMMARY

The disclosure relates to lattice-mismatched core-shell quantum dots (QDs). In certain embodiments, the disclosure relates to lattice-mismatched QDs formed by epitaxial deposition of a compressive shell, e.g., ZnS, ZnSe, ZnTe, CdS or CdSe, onto a soft core, e.g., CdTe or the core has a bulk modulus of less than about 52, 51, 50, 54, 53, 52, 51, 50, 49, 48, 47, 46, 45, 44, or 43 GPa.

In certain embodiments, the lattice-mismatched quantum dots comprise a core and a compressive shell wherein the lattice mismatches are greater than about 7.5, 8.0, 8.5, 9.0, 9.5, 10.0, 10.5, 11.0, or 11.5%. In certain embodiments, the core has a lattice constant greater than about 0.5, 0.6, 0.7, 0.8, or 0.9 angstroms than the epitaxial deposited compressive shell. In certain embodiments, core material is CdTe and a lattice constant for the compressive shell is less than about 6.0, 5.9, 5.8, 5.7, or 5.6 angstroms.

In certain embodiments, the disclosure relates to lattice-mismatched core-shell quantum dots comprising a XTe core coated with a compressive shell wherein X is Cd or Hg wherein the core and shell is not CdTe/CdSe. Typically, the core is CdTe and the compressive shell comprises ZnS, ZnSe and/or CdS. In certain embodiments, the core diameter is about 1.8, 2.0, 2.2, 2.5, 2.8, 3.0, 3.5, or 4.0 nm or the core diameter is less than about 2.0, 2.5, 3.0, 3.5, 4.0 4.5, or 5.0 nm. In certain embodiments, the compressive shell has two or more monolayers of ZnS, ZnSe, ZnTe, CdS or CdSe or one or more monolayers of ZnO, ZnS, ZnSe, ZnTe, CdO, CdS, CdSe, CdTe, MgO, MgS, MgSe, MgTe, HgO, HgS, HgSe, HgTe, AlN, ALP, AlAs, AlSb, GaN, GaP, GaAs, GaSh, InN, InP, InAs, InSb, TN, TlP, TlAs, TlSb, TlSb, Pbs, PbSe, PbTe, or mixtures thereof. In certain embodiments, the thickness of the compressive shell is more than 1.8, 2.0, 2.2, 2.5, 2.8, 3.0, 3.5, 4.0, 5.0, 6.0, 7.0, 8.0, 9.0, or 10.0 nm.

In certain embodiments, the QDs have a polymer over the compressive shell with carboxylic acid groups, monomers with thiol groups, and monomers with amino groups. In certain embodiments, the polymer does not contain polyethylene glycol monomers. In certain embodiments, the quantum dots disclosed herein are contained in a polymer or glass matrix.

In certain embodiments, the QDs have a biological material conjugated to the compressive shell such as a nucleic acid, polypeptide, cell, antibody, epitope, protein, inhibitor, receptor, or receptor substrate. In certain embodiments, the lattice-mismatched core-shell QDs are used in methods for multicolor molecular, cellular, and in vivo imaging.

In certain embodiments, the disclosure relates to photovoltaic cells and devices comprising quantum dots provided herein. In certain embodiments, the disclosure relates to light-emitting diode comprising quantum dots as provided herein. In certain embodiments, the disclosure relates to a laser comprising QDs disclosed herein.

DETAILED DESCRIPTION

Strain manifests itself uniquely in colloids because the epitaxial layer and its substrate can strain each other synergistically (i.e., interactive straining) and alter their respective properties. Experimental and theoretical calculations reveal that much higher strain can be tolerated in small nanocrystals than their bulk counterparts. Small nanocrystals (less than 5 nm) have a high surface area to volume ratio and highly curved surfaces, allowing the stress from a lattice-mismatched epitaxial shell to be distributed over a large fraction of the constituent atoms. For larger nanocrystals and bulk substrates, the total number of atoms is larger, and the epitaxial stress is imposed on a surface that contains a smaller fraction of the constituent atoms, favoring the formation of strain-relaxing crystalline defects rather than homogeneous strain.

Heteroepitaxial strain within coreshell QDs can be used to alter the optical properties of these nano crystals. In particular, epitaxial growth of a compressive shell material (ZnS, ZnSe, ZnTe, CdS or CdSe) on a small and soft nanocrystalline core (CdTe) dramatically changes the conduction energy band. The lattice strain can control the locations of charge carriers, modulate the excited state lifetimes, tune the absorption and emission spectra across a broad wavelength range, and minimize the spectral overlap between absorption and emission. These results are different from the small spectral shifts (5-7 nm) observed by Chen et al., for CdSe QDs, which are likely not caused by lattice strain but arise from the continuous growth of CdSe cores (not CdS shells) under their experimental conditions. Chen et al., Nano Lett. 3, 799-803 (2003). Strain-tunable QDs have uses in solar energy conversion, multicolor biomedical imaging, and super-resolution optical microscopy based on stimulated emission depletion.

Lattice Strain in Colloidal Nanocrystals

Figure 1:
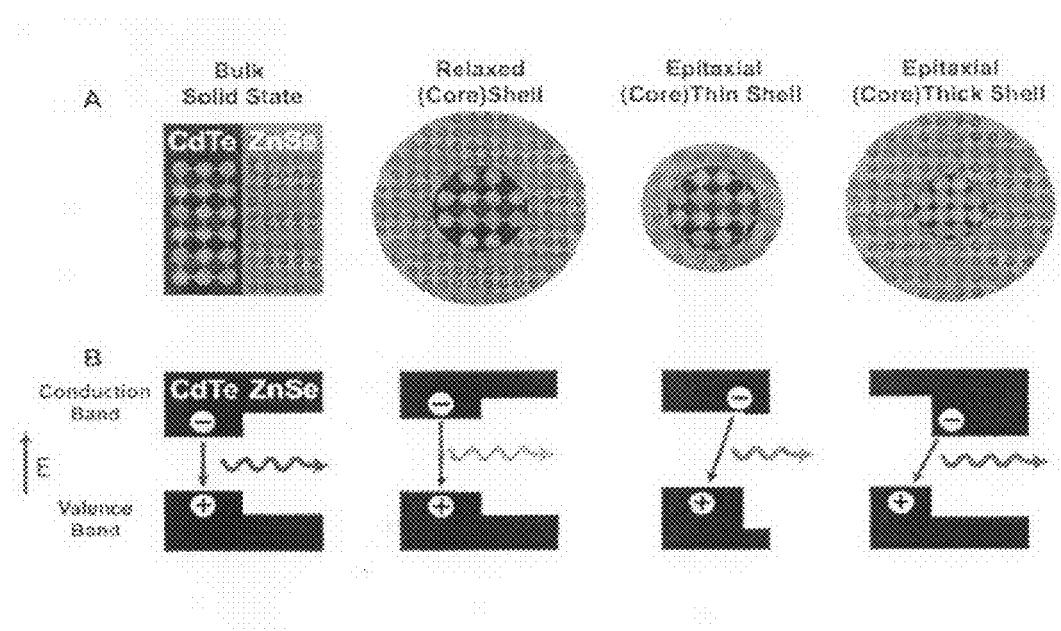
FIG. 1 illustrates band energy changes in quantum dots induced by lattice strain. a, Lattice strain of ordinary and strained (CdTe)ZnSe nanocrystals. b, Valence and conduction band energy levels for the corresponding structures in a. The wavy arrows and their colors indicate band-edge fluorescence emission and their approximate wavelengths. The horizontal band lengths correspond to the thicknesses of the core and the shell. Relaxed nanostructures form standard type-I heterojunctions but are converted to type-II behavior when the core is 'squeezed' and the shell is 'stretched' by the strain from heteroepitaxial growth. The impact of strain is calculated using the model-solid theory and a continuum elasticity model.

Lattice strain can induce significant bandgap energy changes when a shell material is coherently grown on a small and compressible nanocrystalline core. See FIG. 1. In the bulk state, hetero-structures of CdTe and ZnSe have valence and conduction bands that are aligned to localize both the electrons and holes in CdTe (type-I behavior). On the nanometer scale, however, epitaxial growth of a ZnSe shell strongly compresses a CdTe nanocrystal because the lattice parameter of ZnSe (5.668 A) is considerably smaller than that of CdTe (6.482 A). For zinc blende II-VI and III-V semiconductors, the electronic energy gap increases with applied compressive force, and decreases under tensile strain. The conduction band shifts to a larger degree than the valence band and therefore the compressive deformation of CdTe induced by shell growth increases the energy of the conduction band. At the same time, the shell material is under tensile strain, resulting in a decrease in its conduction band energy. These two strain effects work in a concerted fashion (that is, double straining) to alter the energy band offsets, converting standard type-I QDs into type-II heterostructures, resulting in a spatial separation of the electrons and holes. As the shell grows in thickness, the core conduction band energy rises due to increased compressive strain from the shell, while the shell's conduction band energy decreases due to a reduction in quantum confinement.

Properties of Strain-Tuned Nanocrystals

Figure 2:
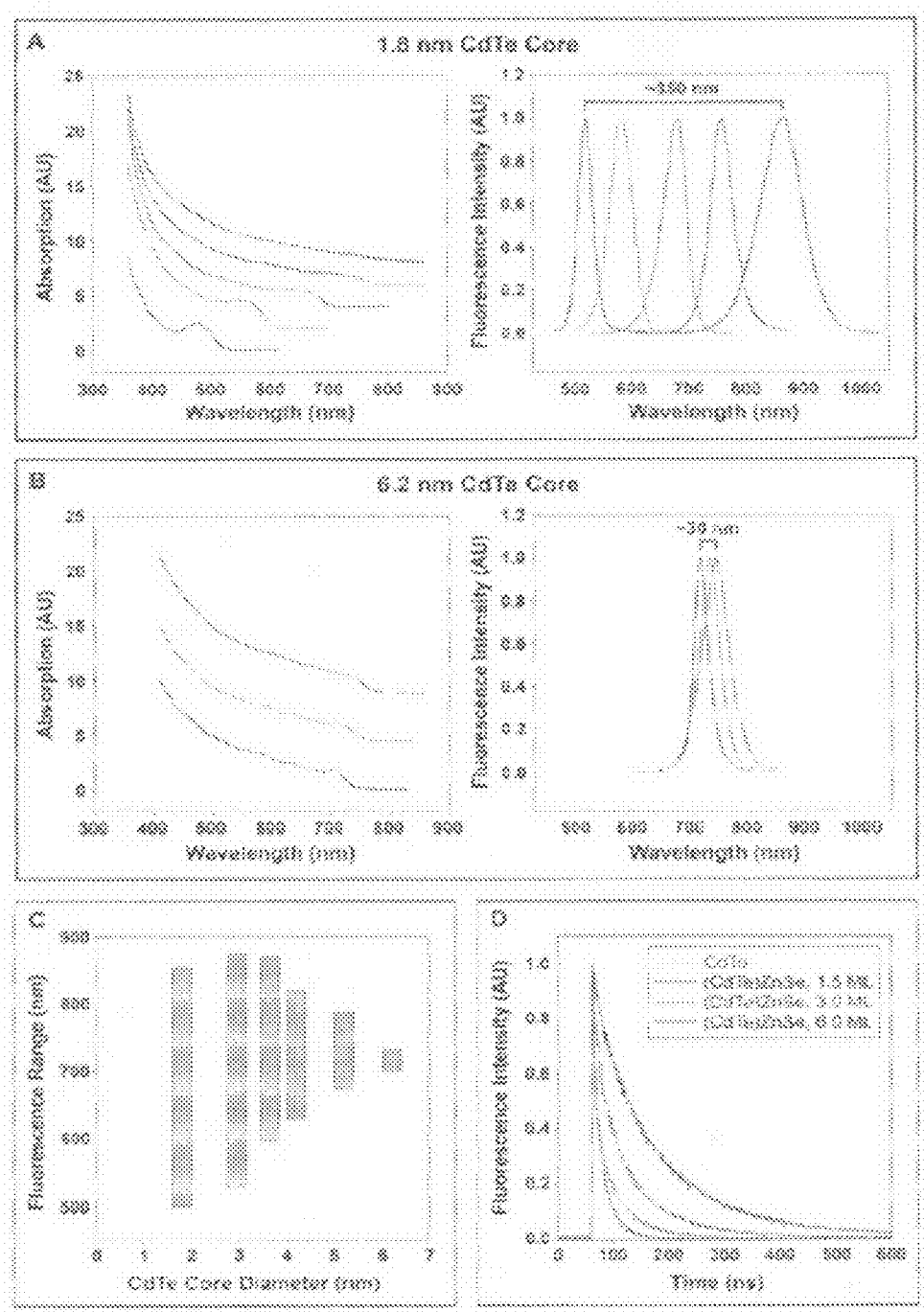
FIG. 2 shows data on optical properties of strain-tuned QDs. a,b, Absorption (left) and fluorescence (right) spectra of (CdTe)ZnSe QDs with 1.8-nm (a) and 6.2-nm (b) CdTe cores, capped with different thicknesses of ZnSe. c, Strain-tunable spectral ranges for different CdTe core sizes, as measured by the fluorescence emission peaks with 0-5 ML of shell growth. d, Time-resolved fluorescence decay curves of 3.8-nm CdTe cores capped with ZnSe shells of different thicknesses. The excited state lifetimes were calculated to be 18.4 (core), 35.5 (1.5 ML), 59.8 (3.0 ML) and 115.0 ns (6.0 ML).

With increasing epitaxial shell growth of ZnSe on CdTe, the optical absorption and fluorescence emission spectra are dramatically shifted towards longer wavelengths (lower energies) (FIG. 2a). Small spectral changes are also observed in type-I QDs when a finite potential well of the shell allows tunneling of the electron and hole between the core and the shell. In the case of (CdTe)ZnSe, however, additional shell growth continues to shift the absorption band-edge and the emission maximum, beyond the band-edge energy of bulk CdTe (1.50 eV) and ZnSe (2.82 eV) (see FIG. 2a). Several lines of evidence suggest that this redshift is due to a transformation to type-II band alignment: (i) a gradual reduction of distinct optical absorption features; (ii) a decrease in the band-edge oscillator strength, and (iii) a significant increase in excited state lifetimes (FIG. 2d). These changes are caused by spatial separation of holes into the core and electrons into the shell, resulting in a decrease in the electron—hole overlap integral. Colloidal type-II quantum dots such as (CdTe)CdSe can achieve charge carrier separation through the selection of specific materials with staggered band offsets for the core and shell. See Kim et al., J. Am. Chem. Soc. 125, 11466-11467 (2003). Type-II band alignments allow spatially indirect recombination at energies lower than the bulk bandgap energies of either of the individual semiconductors.

The largest spectral shifts are observed with very small cores, such as 1.8-nm CdTe, allowing tuning from the green to the near-infrared spectra. In contrast, larger CdTe cores cannot be effectively compressed through epitaxy, and their emission spectra are much less tunable by lattice strain. The strain-tunable spectral ranges are shown in FIG. 2c for differently sized CdTe cores. It is remarkable that QDs with small cores can be tuned to emit beyond the spectral ranges of large dots, at both the blue and red sides of the emission spectra. This novel phenomenon has not been observed for other types of quantum dots. Depending on the core size and shell thickness, these QDs can be tuned to emit between 500 and 1,050 nm with a quantum efficiency between 25 and 60%. The fluorescence peak width is consistently between 40 and 90 nm (full-width at half-maximum, FWHM) in the near infrared (700-900 nm), a 'clear window' well suited for biomedical imaging applications.

An interesting finding is that the strain-induced spectral changes are gradual and do not exhibit an abrupt transformation as might be expected for a switch from type-I to type-II. For core sizes less than 4 nm in diameter, our data indicate that the transition to type-II behavior is 'complete' after capping with 2-3 monolayers (ML) of shell material, as defined by the complete disappearance of the first exciton absorption peak. Between 0 and 2-3 ML, however, the behavior of these QDs lies between type-I and type-II. Here, one of the charge carriers is strongly confined to one region of the nano-crystal (in our case, the hole is confined to the core), whereas the other charge carrier (the electron) is weakly confined, being largely delocalized across the entire nanocrystal.

Strain in Multilayered Structures

Figure 3:
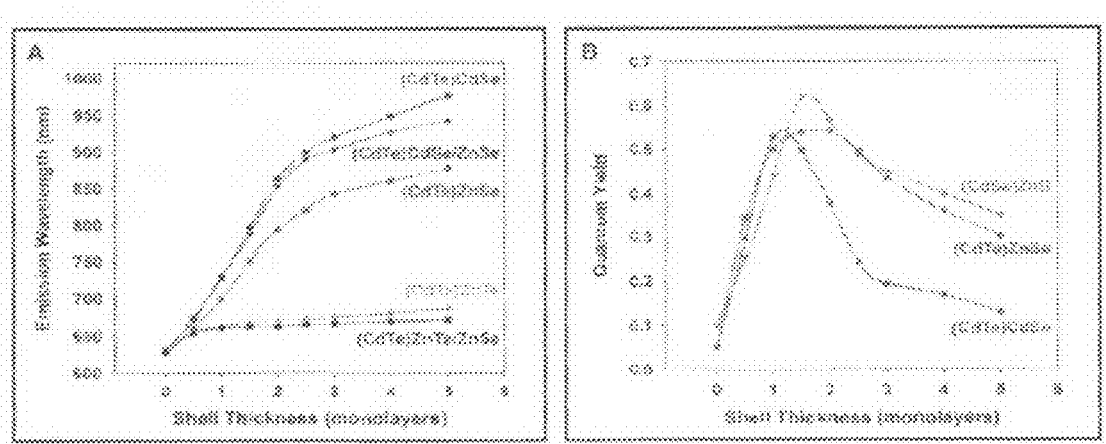
FIG. 3 illustrates comparison of emission wavelengths and quantum yields for different (core) shell and multilayered structures. a, Emission wavelengths of 3.8-nm CdTe cores capped with CdSe (purple), ZnSe (red) or ZnTe (green), or one monolayer of CdSe followed by ZnSe (CdSe/ZnSe; black), or one monolayer of ZnTe followed by ZnSe (ZnTe/ZnSe; blue). b, Quantum yields of a 3.8-nm CdTe core capped with 1-5 ML CdSe (purple) or ZnSe (red), or a 3.8-nm CdSe core capped with 1-5 ML ZnS (brown). c, Bulk band structures for the materials in a. d, Quantum-confined and strained band structures calculated using model-solid theory and a continuum elasticity model.

To further understand the separation of electrons and holes in these strained nanostructures, systematic capping experiments were carried out in which interim shell layers are used to provide specific energy barriers to either the hole or the electron (FIG. 3). Capping CdTe with a CdSe shell is known to generate type-II QDs with the electron located in the shell, due to the lower conduction band energy level of CdSe compared to CdTe. In contrast, capping CdTe with a ZnTe shell or an interim layer of ZnTe provides a large barrier to electron diffusion out of the QD core, but little impediment to hole diffusion out of the core. Capping CdTe with CdSe yields a type-II QD with a substantial decrease of the bandgap, whereas ZnTe capping only slightly changes the band gap. By using one monolayer of these materials as a barrier to hole or electron diffusion, overgrowth of ZnSe leads to a type-II structure only when grown with the CdSe interim layer. Little redshift is observed for QDs with an interim layer of ZnTe, confirming that electron diffusion into the shell is important for the strain-induced type-II structure to function. Hole confinement to the core is also supported by the high quantum efficiency of these (core)shell QDs, as surface hole traps are more detrimental to the optical properties of QDs than are electron traps.

It is remarkable that the highly strained (CdTe)ZnSe heterostructures (14.4% lattice mismatch) are able to maintain excellent photoluminescence properties. The high quantum yield may be attributable to the high crystallinity of the initial CdTe cores (quantum yield up to 80%), and the homogeneity of shell growth at high temperatures (shell growth was incomplete and non-uniform below 200 C). Also, the lattice compressibility is considerably higher for CdTe (bulk modulus $B_u$=42.4 GPa) and ZnSe ($B_u$=62.4 GPa) (considered to be softer because of their lower modulus values) than the commonly used QD materials CdSe ($B_u$=53.1 GPa) and ZnS ($B_u$=77.1 GPa). Thus, the ability of CdTe and ZnSe to elastically compress when subjected to a large stress, rather than relaxing to form defect trap sites, allows these QDs to maintain their excellent spectral properties. These QDs maintain a high quantum yield after 2 ML of shell growth (FIG. 3b), unlike similarly strained (CdSe)ZnS QDs (12% lattice mismatch), which reach a peak in quantum yield after roughly 1.5 ML of shell growth. This difference is likely due to the inability of the less elastic CdSe and ZnS to withstand strain without forming defects. Using the softer CdTe core, growing both CdS and ZnS shells (11.4% and 19.8% lattice mismatches, respectively) produces QDs in which a high quantum yield is maintained even after 3 ML of shell growth.

Figure 6:
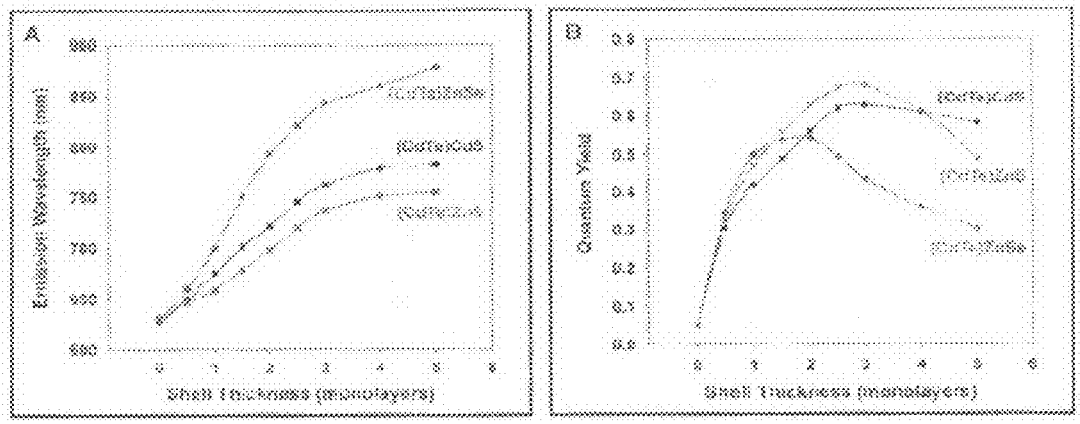
FIG. 6 shows data comparing optical tunability and fluorescence quantum yields for CdTe cores coated with different shell materials and thicknesses. (A) Emission wavelengths of 3.8 nm CdTe cores capped with ZnSe, CdS, or ZnS as a function of shell thickness. (B) Fluorescence quantum yields of the same QDs plotted as a function of shell thickness.

The concept of strain-induced defect formation has been the predominant paradigm for understanding the photoluminescence efficiency of (core)shell QDs, but this concept does not account for the low quantum efficiencies of type-II QDs. Xie et al., reported that type-II (ZnTe)CdSe QDs have a quantum yield of 15-20%, which decreases after growth of 1.5 ML, despite a lattice mismatch of only 0.6%. Adv. Mater. 17, 2741-2745 (2005). FIG. 3b shows data suggesting that type-II (CdTe)CdSe QDs (7.1% lattice mismatch) reach a peak in fluorescence efficiency after only 1 ML of shell growth, whereas highly strained (CdTe)ZnS QDs (19.8% lattice mismatch) reach a peak fluorescence efficiency after 2.5-3 ML of shell growth (see FIG. 6). Thus, (CdTe)ZnS and (CdTe)ZnSe QDs are more desirable than (CdTe)CdSe QDs if they have a sufficiently thick shell to red or infrared-shift the fluorescence and maintain adequate quantum yields resulting in light emission with high quantum yields (60%) across a broad spectrum of visible and near-infrared wavelengths (500 to 1,050 nm).

The separation of charge carriers in type-II QDs can result in a decreased probability of radiative recombination, and the extended excited-state lifetimes may increase the probability of nonradiative recombination events. In addition, one of the charge carriers in type-II QDs is confined to the shell region, and this carrier thus has an increased probability of being trapped in a surface defect site, a major factor governing the photoluminescence efficiency of QDs.

Structural Characterization

Figure 4:
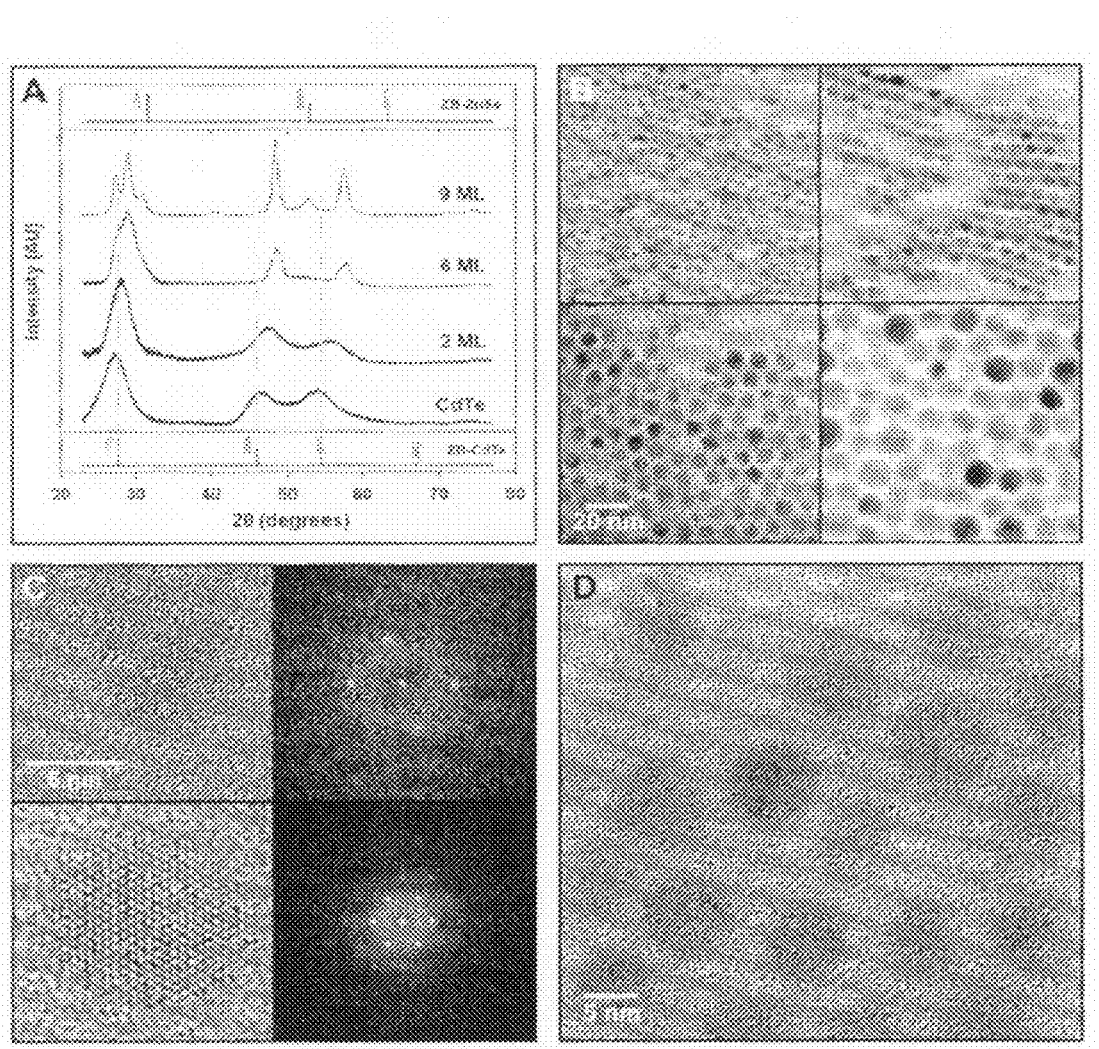
FIG. 4 shows powder X-ray diffraction (XRD) and transmission electron microscopy (TEM) data of strain-tunable QDs. a, XRD patterns for 3.8-nm CdTe and (CdTe)ZnSe QDs with 2, 6 or 9 ML of shell. Bulk diffraction peaks for zinc blende (ZB) ZnSe (top) and ZB CdTe (bottom) are indexed. b, TEM of 3.8-nm CdTe QDs (top left) and (CdTe)ZnSe QDs with 2 (top right), 6 (bottom left) or 9 (bottom right) ML of shell. c, HRTEMs with fast-Fourier transforms of 3.8-nm CdTe QDs (top) and (CdTe)ZnSe QDs with 6 ML of shell (bottom). d, HRTEM of (CdTe)ZnSe QDs with 6 ML shell. Scale bars: b, 20 nm; c, 5 nm; d, 5 nm.

Powder X-ray diffraction (XRD) data (FIG. 4a) shows that certain QDs grow homogeneously as uniform crystalline domains. The CdTe cores show a zinc-blende crystal structure, which shifts to smaller bond lengths with shell growth. After 6 ML (monolayers) of shell growth, the lattice constant has shrunk by 5.1% relative to zinc blende CdTe, indicating an expansion of the ZnSe shell lattice by 8.5% compared to bulk. Further increasing the shell thickness to 9 ML nearly doubles the total nanocrystal volume, but only slightly changes the lattice parameters. The diffraction peaks become narrower due to the larger crystalline domains produced, with no evidence of pure ZnSe or CdTe domains. Combined with the quasi-spherical morphology of these particles observed in transmission electron microscopy (TEM) images (FIG. 4b), these data suggest that crystal growth is coherent and homogeneous, despite the large strain between the core and the shell materials. The XRD spectra show patterns of a hexagonal lattice with shell growth, indicated by splitting of the (111) reflection and the development of a peak between the (220) and (311) reflections. However, simulations of the diffraction patterns of these structures reveal that these observations are not indicative of a phase change. Instead, these changes reflect the polymorphic nature of II-VI materials, which are commonly found to be poly-types of wurtzite (hexagonal) and zinc blende (cubic) phases in bulk and as nanostructures. This polytypism manifests itself in stacking faults in the [111] zinc blende direction, which can be prevalent even in highly crystalline materials due to the minute energy difference between these two structures. Our structural simulation data demonstrate that all of the (core)shell nanocrystals characterized in FIG. 4 are pre-dominantly zinc blende, with 30-40% of the (111) lattice planes stacked in the hexagonal geometry. Therefore, the increasing hexagonal nature of the diffraction patterns is caused solely by the narrowing of the diffraction peaks with coherent shell growth, which reveals the underlying cubic—hexagonal polytypism that is obscured by the wide diffraction peaks of small cores.

High-resolution TEM data (FIG. 4c,d) further reveal the coherent crystallinity of these QDs, with lattice planes extending throughout the entire nanocrystal. Lattice warping and electron-density differences were also observed for strained core—shell structures. However, other than low-energy stacking faults, no major crystalline defects are observed, consistent with the high quantum yield and band-edge emission observed throughout shell growth. Nearly all QDs with shells larger than 2 ML were identified to be oriented with the zinc blende (111) plane parallel to the TEM grid. This anisotropy is in agreement with XRD patterns and simulations of samples with thick shells (FIG. 4a), showing narrower and more intense peaks for the nanocrystal reflections perpendicular to the [111] axis. This preferential growth is attributed to the anisotropy of the underlying zinc blende CdTe cores, which are found to be slightly elongated in the [111] direction (FIG. 4c). The prevalence of wurtzite stacking faults in this direction adds a fundamental degree of anisotropy in the underlying crystalline lattice. Importantly, the lattice mismatch between the wurtzite structures of the core and shell materials is slightly larger in the a-direction compared to the c-direction, and the compressibility of wurtzite II-VI materials is higher in directions perpendicular to the t-axis. This suggests that shell growth may be favored to propagate in the radial direction, outward along the cylindrically shaped QDs. This mode of shell growth contrasts with that observed for most CdSe nanocrystals, which typically favor growth in the c-direction of wurtzite structures, commonly attributed to the high reactivity of the c-terminal facet and closer lattice match in this direction.

CdTe is the most compressible of all the II-VI and III-V materials except for mercury telluride, and its deformation potential is also high. This means that the lattice of CdTe is readily compressed, and upon compression, its electronic energy bands shift to a large degree. ZnSe also has a high deformation potential but has a much higher bulk modulus; its role as a less deformable, highly mismatched shell material is likely important in generating the unique optical properties reported. In comparison, core-shell QDs with better lattice matching (such as (CdTe)CdS and (CdSe)CdS) exhibit considerably less spectral shifting due to the reduced lattice strain and lower deformation potential values. Furthermore, nearly all (core)shell nanocrystals and other types of nano-heterostructures are subject to varying degrees of lattice strain due to structural mismatches.

Continuum Elasticity Modeling

Figure 5:
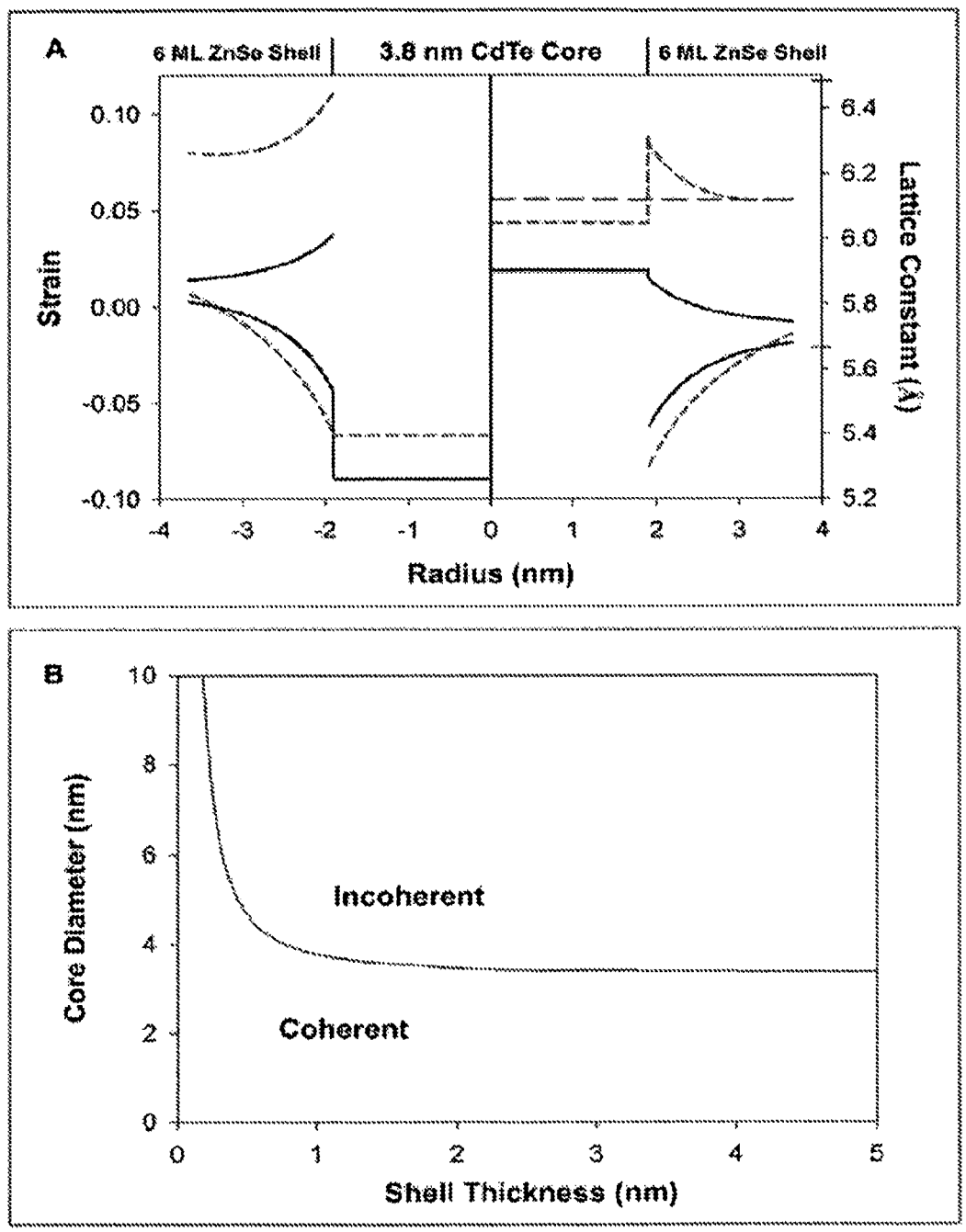
FIG. 5 shows continuum elasticity simulation data for high-strain (CdTe)ZnSe QDs. a, Left: strain distribution in a 3.8-nm CdTe nanocrystal coated with a 6 ML ZnSe shell, modeled as concentric spheres (solid black line) or concentric cylinders (dashed red line). Strain in the core is isotropically compressive, but strain in the shell is tangentially tensile (top line) and radially compressive (bottom line). Right: calculated lattice constants corresponding to spherical and cylindrical strain profiles, compared to the experimental lattice constants (blue dashed line). b, Coherent versus incoherent crystal growth as a function of core size and shell thickness.

To gain further insight into the mechanism of strain tuning, a continuum elasticity model for coherently grown epitaxial ZnSe shells on spherical CdTe cores was implemented (FIG. 5). With radial compression from the shell, the core is found to be under isotropic, compressive strain. The shell lattice is under tensile strain in the tan-gential directions surrounding the core, and compressively strained in the radial direction. The strain in the shell decays with increasing distance from the interface, but does not decay fully to zero. This result demonstrates that thick shells are unable to compress the core to more than a critical value, leaving a significant amount of elastic strain in the shell. Based on the lattice constants experimentally observed from XRD and TEM, the compression of the core should be much larger. This discrepancy is most likely due to the nonspherical growth in the shell occurring perpendicular to the [111] direction causing the heterostructure to more closely resemble concentric cylinders rather than concentric spheres. As shown in FIG. 5a, modeling this system as cylinders redistributes much of the strain to the shell, and more strongly correlates with the experimentally observed lattice parameters. Using this theoretically derived lattice deformation, we have used the model-solid theory to calculate the band offsets and bandgaps of the various (core) shell structures. The bandgaps of these structures at various stages of shell epitaxial growth were predicted. In addition, the continuum elasticity model can be used to predict the shell thickness for which the formation of a dislocation loop is energetically more favorable than coherent, epitaxial growth. FIG. 5b depicts this thickness for different core sizes, demonstrating that CdTe QDs with a diameter less than about 3.5 nm can tolerate strained, coherent growth of ZnSe shells of essentially any thickness.

For these modeling calculations, bulk material parameters are used because no general trends have emerged regarding the dependence of material properties on particle size. Compressibility typically changes with grain size, most commonly showing a softening effect with decreasing size. In other instances, their compressibility values are found to be unchanged in nanoparticles compared to the bulk. For II-VI semiconductors, it has been reported that CdS QDs have similar compressibilities compared to the bulk, whereas CdSe QDs are more compressible than the bulk material. Quantum confinement by itself may induce structural modifications in semiconductor nanocrystals, and these nanocrystals may be subject to compressive or tensile forces depending on the nature of their passivating ligands. For the strain-tunable QDs disclosed herein, the elasticities of nanoscale ZnSe and CdTe have not been determined as a function of particle size. If the elasticities of the core and shell materials decreased evenly, the total elastic strain energy in these dots would be reduced. This energy reduction is not expected to alter crystalline deformation or lead to major net changes in our bandgap calculations. To further examine the case in which only one of the materials becomes more elastic, a theoretical model was implemented using smaller elastic moduli (for example, 20% smaller than bulk) for either the core or shell materials. This softening effect marginally modifies the magnitude of the strain-induced band shifting (by less than 3%). The observed crystalline polytypism may slightly affect the calculated bandgaps. Wei and colleagues calculated a bandgap 1.50 eV for zinc blende CdTe and a bandgap of 1.547 eV for wurtzite. For ZnSe, experimental data of the bandgaps also reveal a very small difference of 2.82 eV for zinc blende and 2.85 eV for wurtzite.

Electronic Devices

In certain embodiments, the disclosure relates to electronic devices comprising quantum dots disclosed herein. In certain embodiments, visual displays utilize light emitting diodes that contain quantum dots disclosed herein. Materials comprising the quantum dots are position between an anode and a cathode. Charge-carriers—electrons and holes—flow into the junction from electrodes with different voltages. When an electron meets a hole, it falls into a lower energy level, and releases energy in the form of a photon.

In certain embodiments, the disclosure relates to a film comprising quantum dots that is placed adjacent to a light emitting diode. The light emitting diode produces light that is absorbed by the quantum dot causing the quantum dot to emit light, e.g., fluoresce.

In certain embodiments, a system comprises a transparent film comprising quantum dots, and light emission layer, between a hole-transporter layer (HTL) and an electron-transport layer (ETL).

Organic electroluminescent materials are typically in favor of injection and transport of holes rather than electrons. Thus, the electron-hole recombination generally occurs near the cathode. In order to prevent the produced excitons or holes from approaching cathode, a hole-blocking layer plays dual roles in blocking holes moving towards the cathode and transporting the electrons to the emitting QD layer. Tris-Aluminium (Alq3), bathocuproine (BCP), and TAZ are typically used hole-blocking materials.

In certain embodiments, a device comprises a metal cathode, e.g., Au and Ag, a electron transporting layer (ETL), e.g., ZnO:SnO2 (ratio 1:3), a light emission layer comprising the quantum dots disclosed herein, energy barrier layer, e.g., $SiO_2$, and a hole transporting layer (HTL), e.g., p-silicon. Resistivity of p-type silicon may be about 10-100 ohm cm. The emission may be observed through the top metal cathode.

The array of quantum dots may be manufactured by self-assembly in process known as spin-casting; a solution of quantum dots in an organic material is poured into a substrate, which is then set spinning to spread the solution evenly.

Contact printing process for forming QD thin film is generally described in Kim et al., (2008) Nano Letters 8: 4513-4517. The overall process of contact printing typically comprises providing a polydimethylsiloxane (PDMS) molded stamp; coating the top side the PDMS stamp with a thing film of parylene-c, a chemical-vapor deposited (CVD) aromatic organic polymer; inking the parylene-c coated stamp is via spin-casting of a solution of colloidal QDs suspended in an organic solvent; and contact printing the formed QD monolayer transformed on to the substrate after the solvent evaporates.

In certain embodiment, the disclosure relates to devices comprising an electrode such as indium tin oxide coated with p-paraphenylene vinylene and a film comprising quantum dots disclosed herein. The quantum dots may be held together with multidentate ligands such as an alkyl dithio, hexane dithiol and held to the surface of the electrode. See Colvin et al., Nature 1994, 370, 354, hereby incorporated by reference.

In certain embodiments, the disclosure relates to light emitting diodes comprising films of conjugated polymers such as poly[2-methoxy-5-(2-ethylhexyloxy)-1,4-phenylenevinylene] (MEH-PPV) and or poly[(9,9-dihexylfluorenyl-2,7-diyl)-co-(1,4-{benzo-[2,1',3]thiadiazole})] (F6 BT) and quantum dots disclosed herein. See Tessler et al., Science 2002, 295, 1506, hereby incorporated by reference.

In certain embodiments, the disclosure relates to light emitting diodes comprising quantum dots disclosed herein coated with a layer of trioctylphosphine oxide (TOPO) and/or trioctylphosphine (TOP). The coated quantum dots can be arranged between electrodes, e.g., indium tin oxide (ITO) coated on a glass substrate, and adjacent to a hole-transporting material such as a N,N'-diphenyl-N,N'-bis(3-methylphenyl)-(1,1'-biphenyl)-4,4'-diamine (TPD) layer. See Coe et al., Nature 2002, 420, 800, hereby incorporated by reference. Opposite the TPD layer the quantum dot layer may be adjacent to a film of tris-(8-hydroxyquinoline)aluminium (Alq3) in contact with a cathode or optionally a layer of 3-(4-biphenylyl)-4-phenyl-5-t-butylphenyl-1,2,4-triazole (TAZ) introduced between the Alq3 layer. In other embodiments, the quantum dots are in a layer on top of a layer of a conducting polymer such as poly (3,4-ethylenedioxy thiophene):polystyrenesulfonate. See Hikmet et al., J. Appl. Phys. 2003, 93, 3509, hereby incorporated by reference.

Solar Energy Conversion

In certain embodiments, the disclosure relates to quantum dot solar cells, e.g., solar cells with a coating of nanocrystals. A thin film of nanocrystals is obtained by spin-coating. Quantum dot based photovoltaic cells typically utilized dye-sensitised colloidal $TiO_2$ films.

In certain embodiments, the solar cell comprises a pair of electrodes wherein a layer of quantum dots disclosed herein is between the electrodes, typically contained in a polymer film, e.g., poly (3-hexylthiophene). One electrode may be an indium tin oxide substrate optionally coated with poly(ethylene dioxythiophene) doped with polystyrene sulfonic acid (PEDOT:PSS, a conducting polymer). See Huynh et al., Nature 2002, 295, 2425, hereby incorporated by reference.

In certain embodiments, the solar cell comprises $TiO_2$ film adjacent to quantum dots disclosed herein and a hole transport layer of the conjugated polymer poly(9,9-dioctyl-fluorene-co-N-(4-butylenphenyl)diphenylamine). The cells are typically prepared on fluorinated tin oxide (FTO) coated glass following a layer-by-layer growth using aqueous solutions of the polycations, poly(ethyleneimine) (PEI), poly (diallyl dimethylammonium chloride) (PDDA), negatively charged $TiO_2$ nanoparticles in basic solution, and negatively charged quantum dots disclosed herein. See Kniprath et al., Thin Solid Films. 518 (1), 295-298 (2009), hereby incorporated by reference.

Biological Applications

Quantum dots can be used in any biological applications where traditional organic dyes are utilized. QDs are typically superior to traditional organic dyes because of brightness (owing to the high extinction co-efficient combined with a comparable quantum yield to fluorescent dyes) and stability (allowing much less photobleaching).

The photostability of quantum dots allows the acquisition of many consecutive focal-plane images that can be reconstructed into a high-resolution three-dimensional image. Another application of quantum dot probes is the real-time tracking of molecules and cells over extended periods of time. Antibodies, streptavidin, peptides, nucleic acid aptamers, or small-molecule ligands can be used to target quantum dots to specific proteins on cells.

In certain embodiments, the disclosure relates to the use of quantum dots disclosed herein for in vitro imaging of pre-labeled cells, e.g., imaging single-cell migration in real time for embryonic cells, cancer cells, stem cells, and lymphocytes. For example, quantum dots disclosed herein may be use for tumor targeting under in vivo conditions by active targeting and passive targeting. In the case of active targeting, quantum dots are functionalized with tumor-specific binding sites to selectively bind to tumor cells or the tumor microenvironment. Passive targeting utilizes the enhanced vascular permeability of blood vessels in cancer tissue for the delivery of quantum dot probes. Tumors typically have a more permeable endothelium than normal tissue allowing the leakage of small nanoparticles into the cancer tissue interstitium. Moreover, tumor cells lack an effective lymphatic drainage system, which leads to subsequent nanoparticle-accumulation.

The surface of quantum dots disclosed herein may be tailored to interact with the biological sample through electrostatic and hydrogen-bonding interactions or through specific ligand-receptor interactions such as avidin-biotin interactions. In certain embodiments, the quantum dots disclosed herein are coated with a layer of silica, e.g., coating them with 3-(trihydroxylsilyl)propyl methylphosphonate, in order to make them water soluble or methoxysilylpropyl urea and acetate for bind to cellular nuclei. In other embodiments, biotin is covalently bound to the surface of the quantum dots. See Bruchez et al., Science 1998, 281, 2013 hereby incorporated by reference.

Conjugating biological material to quantum dots can be accomplished by a variety of methods. The biological materials may recognize a specific analyte such as a protein, nucleic acid, or virus. Mercaptoacetic acid may be use as a ligand for solubilization and covalent protein attachment. When reacted with ZnS-capped QDs, the mercapto group binds to a Zn atom, and the polar carboxylic acid group renders the QDs water-soluble. The free carboxyl group is available for covalent coupling to various biomolecules (such as proteins, peptides, and nucleic acids) by cross-linking to reactive amine groups. See Chan & Nie, Science 1998, 281, 2016, hereby incorporated by reference.

In certain embodiments, the quantum dots disclosed herein are coated with biological molecules by utilizing electrostatic attractions between negatively charged lipoic acid and biologically engineered bifunctional recombinant (chimeric) proteins comprising positively charged attachment domains (containing a leucine zipper) genetically fused with desired biologically relevant domains. See Mattoussi et al., J. Am. Chem. Soc. 2000, 122, 12142 hereby incorporated by reference.

In certain embodiments, the disclosure relates to quantum dots disclosed herein coated with ligands. In certain embodiment, the ligands are multidentate polymers. Polymer ligands minimize the hydrodynamic size of QDs, provided colloidal stability and prevent photobleaching. In certain embodiments, the disclosure relates to polymer ligands that contain a mixed composition of thiol (—SH) and amine (—NH$_2$) groups grafted to a linear polymer. See Smith & Nie, J Am Chem. Soc. (2008) 130(34): 11278-11279, hereby incorporated by reference. Representative amphiphilic polymers are disclosed in Smith et al. Phys. Chem. Chem. Phys 2006; 8:3895-3903; Pons et al., J. Phys. Chem. B 2006; 110:20308-20316, and Pellegrino et al., Nano Lett 2004; 4:703-303, all hereby incorporated by reference.

In certain embodiments, the ligands are conjugated to a biological molecule or targeting molecule which can be a nucleic acid, polypeptide, cell, antibody, epitope, protein, inhibitor, receptor, or receptor substrate. The nucleic acid molecule may be a probe that hybridizes to a known polymorphic sequence that provides a specific genotype. The polypeptide may target a desired cell marker, i.e., receptor of a protein that is displayed on the surface of a cell that indicates the cell type. They may be dendritic cell markers, endothelial cell markers, B cell markers, T cell markers, natural killer cell markers, cancer cell markers, plasma cell markers, or hemapoietic cell markers.

Quantum dots disclosed herein may be cross-linked to biomolecules such antibodies, oligonucleotides, or small molecule ligands to render them specific to biological targets. See Smith et al., Adv. Drug Deliv. Rev. 60, 1226-1240 (2008), hereby incorporated by reference. This may be accomplished using standard bioconjugation protocols, such as the coupling of maleimide-activated QDs to the thiols of reduced antibodies. The surfaces of QDs may be modified with bio-inert, hydrophilic molecules such as polyethylene glycol, to eliminate possible nonspecific binding, or to decrease the rate of clearance from the bloodstream following intravenous injection. QDs disclosed herein may emit fluorescence without an external source of excitation when conjugated to enzymes that catalyze bioluminescent reactions, due to bioluminescence resonance energy transfer (BRET). See So et al., Nat. Biotechnol. 24 (2006), pp. 339-343, hereby incorporated by reference.

In certain embodiments, quantum dots disclosed herein are cross-linked to small molecule ligands, inhibitors, peptides, or aptamers can bind with high specificity to many different cellular receptors and targets. See Lidke et al., Nat. Biotechnol. 22 (2004), pp. 198-203, hereby incorporated by reference.

In certain embodiments, the quantum dots disclosed herein can be use in sensors for detection of specific nucleic acid sequences. By mixing a single stranded nucleic acid to be detected with (a) an acceptor fluorophores conjugated to a nucleic acid fragment complementary to one end of the target and (b) a biotinylated nucleic acid fragment complementary to the opposite end of the target nucleic acid, these nucleotides hybridize to yield a biotin-nucleic acid-fluorophore conjugate. Upon mixing this conjugate with quantum dots disclosed herein fluorescence is quenched via nonradiative energy transfer to the fluorophore conjugate. This dye acceptor then becomes fluorescent, specifically and quantitatively indicating the presence of the target nucleic acid. See Zhang et al., Nat. Mater. 4 (2005), pp. 826-831, hereby incorporated by reference.

Terms

The "bulk modulus" refers to a material's resistance to uniform compression, i.e., the pressure increase needed to cause a given relative decrease in volume with a base unit is the pascal. In the case of a nanoparticle core it refers to the bulk modulus of the core material as determined in larger dimensions e.g., millimeter dimensions. One can measure the bulk modulus using powder diffraction under applied pressure or by other methods known in the art. See, e.g., Al-Douri et al., Physica B: Condensed Matter, 322, (1-2), 2002, 179-182.

A "lattice constant" or "lattice parameter" refers to the constant distance between unit cells in a crystal lattice. Lattices in three dimensions generally have three lattice constants, referred to as a, b, and c. In the case of cubic crystal structures, all of the constants are equal. Similarly, in hexagonal crystal structures, the a and b constants are equal. Unless otherwise proved the "lattice constant" refers to the average lattice constant in three dimensions. Lattice constants are typically on the order of several angstroms (i.e. tenths of a nanometer). Lattice constants or mismatches can be determined using techniques such as X-ray diffraction or with an atomic force microscope. Some lattice constants are provided in the table below.

| Element or Compound | Type | Name | Crystal Structure | Lattice Constant at 300 K (Å) |
|---|---|---|---|---|
| C | Element | Carbon (Diamond) | DIAMOND | 3.56683 |
| Ge | Element | Germanium | Diamond | 5.64613 |
| Si | Element | Silicon | Diamond | 5.43095 |
| Sn | Element | Grey Tin | Diamond | 6.48920 |
| SiC | IV-IV | Silicon carbide | Wurtzite | a = 3.086; c = 15.117 |
| AlAs | III-V | Aluminum arsenide | Zincblende | 5.6605 |
| AlP | III-V | Aluminum phosphide | Zincblende | 5.4510 |
| AlSb | III-V | Aluminum antimonide | Zincblende | 6.1355 |
| BN | III-V | Boron nitride | Zincblende | 3.6150 |
| BP | III-V | Boron phosphide | Zincblende | 4.5380 |
| GaAs | III-V | Gallium arsenide | Zincblende | 5.6533 |
| GaN | III-V | Gallium nitride | Wurtzite | a = 3.189; c = 5.185 |
| GaP | III-V | Gallium phosphide | Zincblende | 5.4512 |
| GaSb | III-V | Gallium antimonide | Zincblende | 6.0959 |
| InAs | III-V | Indium arsenide | Zincblende | 6.0584 |
| InP | III-V | Indium phosphide | Zincblende | 5.8686 |

-continued

| Element or Compound | Type | Name | Crystal Structure | Lattice Constant at 300 K (Å) |
|---|---|---|---|---|
| InSb | III-V | Indium antimonide | Zincblende | 6.4794 |
| CdS | II-VI | Cadmium sulfide | Zincblende | 5.8320 |
| CdS | II-VI | Cadmium sulfide | Wurtzite | a = 4.160; c = 6.756 |
| CdSe | II-VI | Cadmium selenide | Zincblende | 6.050 |
| CdTe | II-VI | Cadmium telluride | Zincblende | 6.482 |
| ZnO | II-VI | Zinc oxide | Rock Salt | 4.580 |
| ZnS | II-VI | Zinc sulfide | Zincblende | 5.420 |
| ZnS | II-VI | Zinc sulfide | Wurtzite | a = 3.82; c = 6.26 |
| PbS | IV-VI | Lead sulfide | Rock Salt | 5.9362 |
| PbTe | IV-VI | Lead telluride | Rock Salt | 6.4620 |

EXPERIMENTAL

Example 1

Synthesis of CdTe Cores (Core)shell QDs were prepared by using a two-step organometallic approach in a high-temperature coordinating solvent. CdTe cores of various sizes (1.8-6.2 nm) were synthesized by swiftly injecting a room-temperature solution of trioctylphosphine (TOP)-telluride (0.1 mmol in 5 ml octadecene) into a hot (300 C) solution of cadmium oxide (0.2 mmol), tetradecylphosphonic acid (0.44 mmol), hexadecylamine (5.7 mmol) and octadecene (10 ml total). The growth temperature was set to 265 C and the final size of the CdTe QD core was controlled by varying the growth time, and by slow injection of additional precursors if larger sizes were desired. After cooling to room temperature, the luminescent nanoparticles (quantum efficiency 40-80%) were diluted in hexane, centrifuged to remove the insoluble cadmium precursor, purified by means of repeated hexane—methanol extractions, and finally centrifuged again to remove potential nanocrystal aggregates.

Example 2

Shell Growth

A modified version of the successive ion layer adsorption and reaction (SILAR) procedure, originally described by Peng et al., was used J. Am. Chem. Soc. 119, 7019-7029 (1997). Specifically, at the initial capping temperature (TML1), a solution was injected containing a cation precursor (0.1 M diethylzinc or dimethylcadmium dissolved in TOP), containing the amount of precursor required to constitute a 0.25 ML shell. After 10 min, which was experimentally determined to be a sufficient amount of time to prevent homogeneous nucleation of the shell material, the anion precursor was injected (0.1 M sulphur, selenium or tellurium, dissolved in TOP). After this second injection, shell growth was allowed to proceed for a period of time dependent on the initial growth temperature and the shell composition. For example, for the growth of ZnSe on CdTe, the following reaction times were used: 4 h for 150 8C, 2 h for 170 8C and 30 min for 210-225 8C. For other shell materials, however, it was found that the shell growth rate was strongly dependent on the reactivity of the precursors. Both diethylzinc and dimethylcadmium were highly reactive at all of the temperatures used in this work. These reactions were limited by the deposition rate of the chalcogen. Generally, tellurium and selenium reacted efficiently at low temperatures (for example, 2 h reaction time at 170 C), but initial growth of CdS and ZnS required extended times, up to 8 h before completion on 1.8-nm cores at 140 C. After the first two injections at TML1, a second pair of injections was performed to grow 1 ML of total shell on the cores, using the same reaction time for the first 0.5 ML.

Once this thin layer of shell material was deposited on the QDs, indicated by spectral redshifting, the temperature threshold of these QDs towards ripening was significantly enhanced. This is due to a combination of the increase in overall size of the nanocrystals, the greater bond strength and thermal stability of the shell materials used in this study (CdS, CdSe, ZnSe, ZnS and ZnTe) compared to the cores (CdTe), as well as the greater strength of bonding of the amine and phosphine ligands to the shell material, compared to CdTe. After the deposition of just 1 ML, the temperature of the reaction could therefore be increased drastically without optical signs of ripening. In this manner, the growth temperature was increased to a point at which the reaction was much more efficient, and shorter reaction times could be used to complete shell growth. The deposition of ZnSe on CdTe was optimized for all of the sizes tested, but the deposition of the other shell materials (ZnS, ZnTe, CdS and CdSe) was optimized for 3.8-nm QD cores. For this procedure, 0.25 ML increments were used so that the surface stoichiometry of anions and cations would be similar for each 0.5 ML shell growth cycle. When performed with 0.5 ML increments, like the SILAR procedure originally described by Peng et al., there was a significant decrease in quantum yield after each anion injection, thus obscuring the relative changes in fluorescence quantum yield, which is in accord with previous findings. The important experimental parameters for the synthesis of strain-tunable QDs are summarized in the Table 1, and shell thickness data is provided in Table 2.

TABLE 1

| CdTe core size | [QD] | $T_{OW}$ | $T_{ML1}$ | $T_{ML2}$ | $T_{ML3-4}$ | $T_{ML5-6}$ | $T_{ML7-9}$ |
|---|---|---|---|---|---|---|---|
| 1.8 nm | 28 µM | 150° C. | 140° C. | 190° C. | 225° C. | 250° C. | n.a. |
| 3.8 nm | 6.0 µM | 170° C. | 150° C. | 225° C. | 225° C. | 250° C. | 260° C. |
| 5.2 nm | 4.0 µM | 210° C. | 190° C. | 225° C. | 225° C. | 250° C. | n.a. |
| 6.2 nm | 3.0 µM | 230° C. | 225° C. | 225° C. | 225° C. | 250° C. | n.a. |

TABLE 2

| Shell thickness | $n_{ZnSe}/n_{QD}$ | $d_{obs}$ (nm) | $d_{T-S}$ (nm) relaxed | $d_{T-S}$ (nm) strained | $d_{T-C}$ (nm) relaxed | $d_{T-C}$ (nm) strained |
|---|---|---|---|---|---|---|
| 0 (core) | n.a. | 3.75 | n.a. | n.a. | n.a. | n.a. |
| 2 ML | 595 | 4.66 | 4.74 | 5.04 | 4.22 | 4.60 |
| 6 ML | 3071 | 7.37 | 6.85 | 7.31 | 7.08 | 7.79 |
| 9 ML | 6446 | 10.51 | 8.50 | 9.20 | 9.71 | 10.91 |

Example 3

Nanocrystal Characterization

Steady-state fluorescence spectra were obtained using a spectrofluorometer (Photon Technology International). A xenon lamp was used for excitation, a photomultiplier tube was used as a detector for the spectral range 400-800 nm, and an InGaAs detector for the range 800-1,700 nm. The spectrometer slit widths were typically operated at 4 nm. Quantum yield measurements were performed by comparison to Atto dyes (520, 565, 610 or 680) dissolved in ethanol, accounting for differences in solvent refractive index. Absorption spectra were measured on a Shimadzu spectrophotometer with 1-nm slit widths. Time-resolved fluorescence decay spectra were obtained with excitation from a 478-nm pulsed diode laser. A spectrometer was used to resolve the peak emission wavelength, detected using a photomultiplier tube. TEM images were obtained with a Hitachi H-7500 TEM, and high-resolution imaging was performed on a Hitachi H-9500. X-ray diffraction spectra were measured using a Bruker SMART 1000 CCD/Hi-Star dual-detector diffractometer, with a cobalt X-ray source.

Example 4

Simulation of X-Ray Diffraction Spectra

Methods to simulate the X-ray diffraction spectra of small nanocrystals using the Debye equation have been previously described in detail. See Bawendi, et al., J. Chem. Phys. 91, 7282-7290 (1989). Briefly, 20 zinc blende crystal lattice structures were constructed with randomly distributed wurtzite stacking faults in the [111] direction with a specific frequency (0-100%). Atoms were removed from these structures that fell outside a specific nanocrystal shape and size. Core CdTe QDs were simulated as about 850 atom hexagonal cylinders, and (core)shell structures were simulated by extending the lattices of these cores using zinc and selenium atoms. The Debye equation was then solved for these structures using the DISCUS software package. The spectra were averaged to simulate a distribution of stacking faults. Only ten spectra were averaged for the 6 and 9 ML samples due to the long processing times required for such large structures. Thermal effects were incorporated through Debye-Waller factors; however, it should be noted that strain would be expected to have an effect on thermal fluctuations of atoms, but in ways that are not immediately predictable. No surface relaxations were incorporated in the simulations. For comparison with experimental data, the backgrounds of experimental spectra were first conservatively subtracted.

Example 5

Polymer Synthesis

Polyacrylic acid (PAA, MW 1773), N-hydroxysuccinimide (NHS), N,N'-diisopropylcarbodiimide (DIC), cysteamine, β-mercaptoethanol (BME),1-thioglycerol, dimethylsulfoxide (DMSO), dimethylformamide (DMF), cadmium oxide, tellurium, dioctylether (DOE), 5,5'-dithiobis(2-nitrobenzoic acid) (Ellman's reagent), glycine, L-cysteine, acetone, chloroform, methanol, hexane, and piperidine were purchased from Sigma. N-Fmocethylenediamine (Fmoc-EDA) was purchased from ABD Bioquest. Tetradecylphosphonic acid (TDPA) was obtained from Alfa Aesar. Oleylamine was from Acros Organics, trioctylphosphine (TOP) was from Strem, and fluorescamine was purchased from Invitrogen.PAA (1 g, 13.9 mmol carboxylic acids) was mixed with 25 mL DMSO in a 150 mL three-necked flask. After stirring for 24 hours at 35° C., freshly prepared anhydrous solutions of cysteamine (187 mg, 2.43 mmol) and Fmoc-EDA (686 mg, 2.43 mmol), each dissolved in 6 mL DMSO, were added. The solution was protected from light and bubbled with argon for 30 minutes at 35° C. After the addition of an anhydrous solution of NHS (1.12 mg, 9.71 mmol) in 6 mL DMSO, DIC (736 mg, 5.83 mmol) was slowly added over the course of 40 minutes during vigorous stirring. Bubbling was continued for 30 minutes, and then the reaction was allowed to proceed for 7 days at 40° C. in the dark. Piperidine (18 mL) was then added, and the solution was stirred for four hours to deprotect the primary amines. BME (501 mg, 6.41 mmol) was added to quench the reaction, and the solution was stirred for 2 hours at 40° C., then cooled to room temperature and filtered. The mixture was condensed to ~4 mL at 45° C. under vacuum (~40 Pa), and the polymer was precipitated with the addition of a 2:1 mixture of ice-cold acetone:chloroform, and isolated via centrifugation. The polymer was dissolved in ~5 mL anhydrous DMF, filtered, and precipitated again with acetone-chloroform. This process was repeated three times, and the polymer was finally washed with acetone, dried under vacuum, and stored under argon. This modified polymer was a white powder, soluble in water, DMSO, DMF, or methanol, but insoluble in acetone, unlike PAA. If stored under air, this polymer darkened and became yellow-brown over the course of a few weeks, and also became increasingly difficult to dissolve in various solvents.

Example 6

Synthesis of CdTe Nanocrystals

CdO (25.7 mg, 0.2 mmol), TDPA (122 mg, 0.44 mmol), and DOE (2 mL) were added to a three-necked flask and

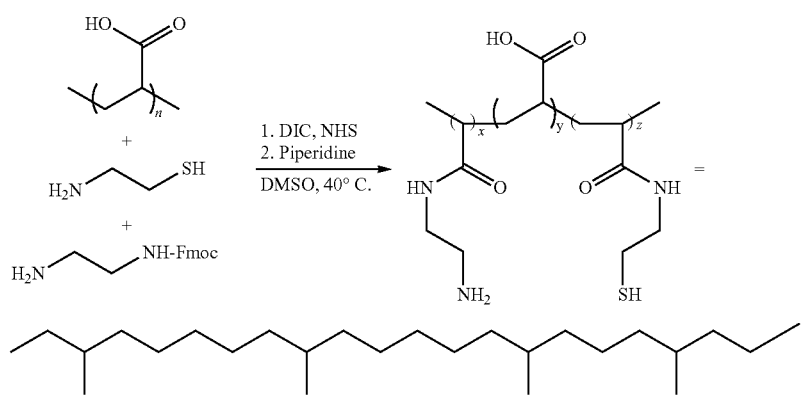

heated to 250° C. under argon until complete dissolution of CdO. After cooling to room temperature, oleylamine (1 g, 3.74 mmol) and 6.5 mL DOE were added. The solution was heated to reflux under vacuum (~20 Pa, ~65° C.) for 1 hour and then heated to 300° C. under argon flow. A second solution, containing tellurium (12.76 mg, 0.1 mmol), TOP (2 mL), and DOE (3 mL), was injected into the cadmium precursor solution, and the growth temperature was set to 265° C. Using this method, highly monodipserse nanocrystals could be grown between 2.5 and 3.5 nm diameter after reaction times between 20 seconds and 10 minutes. To grow larger nanocrystals, additional cadmium and tellurium precursors were sequentially injected dropwise into the reaction solution, starting at 4 minutes after the first injection. After reaching the desired size, the reaction mixture was cooled to room temperature, diluted with 85 mL hexane, and centrifuged to remove most of the excess cadmium precursor. The QDs were isolated using at least six hexane-methanol extractions. On the final extraction, the QDs were condensed to ~1 mL through the addition of methanol. These QDs were then diluted to ~20 mL with chloroform, bubbled with argon for 30 minutes and stored at 4° C. in the dark. QD size was determined from its known correlation with the first exciton peak wavelength, and verified via TEM.

Example 7

Ligand Exchange with 1-Thioglycerol

Purified CdTe QDs (2.5 nm) in chloroform (7 mL, ~150 uM) were added to a three-necked Ligand exchange with 1-thioglycerol flask connected to a Schlenk line. Under intense stirring, neat 1-thioglycerol was added dropwise until the first visible sign of flocculation. Then 4 mL of DMSO was added dropwise. An excess of 1-thioglycerol (3 mL) was then added, and chloroform was removed under vacuum at 25° C. After stirring for an additional 2 hours at 25° C. under argon, the QDs were precipitated with the addition of an ice-cold mixture of acetone:chloroform (1:1, 193 mL total). Following centrifugation, the pellet was washed with acetone and dried under vacuum.

Example 8

Coating Quantum Dots with the Multidentate Polymer Ligand

Figure 7:
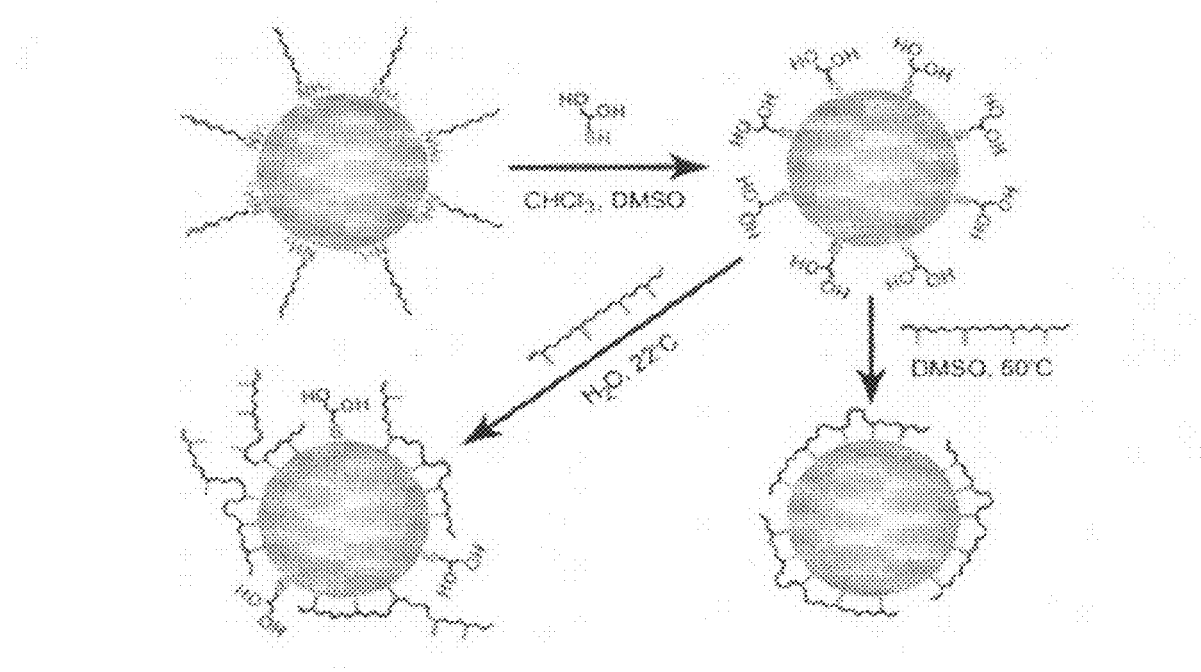
FIG. 7 illustrates the preparation of a polymer ligand coating over typical QDs disclosed herein. Typically one first exchanges the native ligands with thioglycerol. These polar monovalent ligands are then replaced with the multidentate ligand. Stable, compactly coated QDs are produced after heating (60-70° C.) for 1-2 hours in DMSO under inert conditions.

Two techniques were used to coat 1-thioglycerol QDs with the modified polymer, as depicted in FIG. 7. In the first method, CdTe QDs coated with 1-thioglycerol were suspended in basic water (50 mM sodium hydroxide), centrifuged at 7000 g for 10 minutes, and then filtered to remove aggregated nanocrystals. Various amounts of polymer dissolved in basic water were added to the QDs, which were then gently mixed. Using this method, addition of an excess of ligand resulted in complete precipitation of the QD over the course of several hours. In the second method, QDs coated with 1-thioglycerol were suspended in DMSO and centrifuged at 7000 g for 10 minutes to remove possible nanocrystal aggregates. The nanocrystals were diluted to ~5-20 µM for smaller sizes (2.5-3.5 nm), or ~2-5 µM for larger nanocrystals. The QDs were then degassed extensively at room temperature and charged with argon. An anhydrous DMSO solution of the polymer (~5 mg/mL) was added under vigorous stirring. The solution was then heated to 60° C. for 90 minutes for smaller QDs (2.5-3.5 nm), or 70-75° C. for 120 minutes for larger nanocrystals. In the absence of the polymer, the nanocrystals aggregated and precipitated from solution during heating. Indeed, the multidentate polymer greatly enhances the thermal stability of these nanocrystals, as there was no evidence of Ostwald ripening of 2.5 nm cores up to ~130° C. After cooling the QDs to room temperature, ice-cold aqueous sodium hydroxide (50 mM, twice the volume of DMSO) was slowly added, and the solution was stirred for 2 hours. The QDs were then extensively dialyzed against basic water for 2-3 days using 25 kDa molecular weight cutoff dialysis tubing (Spectra/Por).

The invention claimed is:
1. A lattice-mismatched quantum dot comprising a core consisting of CdTe and a compressive shell over the surface of the core, wherein the core diameter is at least 1.8 nm and less than 4.0 nm and wherein the compressive shell is 2.5 or more monolayers of ZnS or ZnSe grown directly on the surface of the CdTe core.
2. The lattice-mismatched quantum dot of claim 1 further comprising a polymer over the compressive shell.
3. The lattice-mismatched quantum dot of claim 1 further comprising a biological material conjugated to the compressive shell.
4. The lattice-mismatched quantum dot of claim 3, wherein the biological material is a nucleic acid, polypeptide, cell, antibody, epitope, protein, inhibitor, receptor, or receptor substrate.
5. A photovoltaic cell comprising the lattice-mismatched quantum dot of claim 1.
6. A light-emitting diode comprising the lattice-mismatched quantum dot of claim 1.
7. The lattice-mismatched quantum dot of claim 1, wherein the compressive shell has three or more monolayers of ZnS or ZnSe.

* * * * *